United States Patent
Nickel

(10) Patent No.: US 10,001,538 B2
(45) Date of Patent: Jun. 19, 2018

(54) METHOD AND MAGNETIC RESONANCE SYSTEM THAT DETERMINES OPERATIONAL SAMPLE POINTS IN K-SPACE OF A RANDOM UNDERSAMPLING SCHEME WHEN ACQUIRING MAGNETIC RESONANCE DATA

(71) Applicant: Marcel Dominik Nickel, Erlangen (DE)

(72) Inventor: Marcel Dominik Nickel, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1451 days.

(21) Appl. No.: 13/859,946

(22) Filed: Apr. 10, 2013

(65) Prior Publication Data
US 2013/0265052 A1    Oct. 10, 2013

(30) Foreign Application Priority Data
Apr. 10, 2012   (DE) .................. 10 2012 205 811

(51) Int. Cl.
*G01R 33/56* (2006.01)
*G01R 33/561* (2006.01)

(52) U.S. Cl.
CPC .......... *G01R 33/56* (2013.01); *G01R 33/5611* (2013.01)

(58) Field of Classification Search
USPC ............ 324/300–322; 600/407–435; 382/128–131
See application file for complete search history.

(56) References Cited

U.S. PATENT DOCUMENTS

| | | | | |
|---|---|---|---|---|
| 6,556,009 B2* | 4/2003 | Kellman | ........... | G01R 33/5611 324/307 |
| 8,901,927 B2* | 12/2014 | Gross | ................. | G01R 33/5611 324/309 |
| 9,588,207 B2* | 3/2017 | Weller | ............... | G01R 33/5611 |
| 9,594,141 B2* | 3/2017 | Weller | ............... | G01R 33/5611 |
| 2002/0097050 A1* | 7/2002 | Kellman | ........... | G01R 33/5611 324/309 |
| 2008/0012562 A1 | 1/2008 | Beatty | | |

(Continued)

OTHER PUBLICATIONS

Blaimer et al. "SMASH, SENSE, PILS GRAPPA" Top Magn, Reson. Imaging, vol. 15, No. 4, Aug. 2004.

(Continued)

*Primary Examiner* — Melissa Koval
*Assistant Examiner* — Tiffany Fetzner
(74) *Attorney, Agent, or Firm* — Schiff Hardin LLP

(57) ABSTRACT

In a method and magnetic resonance (MR) apparatus to determine sample points of a random undersampling scheme of k-space to acquire reduced MR data with multiple coils, a set of sample points of the random undersampling scheme to acquire the reduced MR data is determined, and an indicator of a signal noise in reconstructed MR data is calculated. Furthermore, an additional sample point, which is not included in the set of sample points is determined, and a change of the indicator that results by an addition of the additional sample point to the set of sample points is calculated. The additional sample point is selectively added to the set of sample points dependent on the calculated change.

15 Claims, 7 Drawing Sheets

(56) References Cited

U.S. PATENT DOCUMENTS

| | | | |
|---|---|---|---|
| 2008/0154115 A1* | 6/2008 | Fuderer | G01R 33/5611 324/309 |
| 2012/0133361 A1* | 5/2012 | Gross | G01R 33/5611 324/309 |
| 2013/0088225 A1* | 4/2013 | Weller | G01R 33/5611 324/307 |
| 2013/0099786 A1* | 4/2013 | Huang | G01R 33/246 324/309 |
| 2013/0207652 A1* | 8/2013 | Weller | G01R 33/5611 324/309 |
| 2013/0265052 A1* | 10/2013 | Nickel | G01R 33/56 324/309 |

OTHER PUBLICATIONS

Pruessmann et al. "Advances in Sensitivity Encoding with Arbitrary k-Space Trajectories", Magnetic Resonance in Medicine, vol. 46, (2001) pp. 638-651.

Lustig et al., "SPIRIT: Iterative Self-consistent Parallel Imaging Reconstruction From Arbitrary k-Space", in: Mag. Reson. Med. vol. 64, (2010) pp. 457-471.

Pruessmann et al. "SENSE: Sensitivity Encoding for Fast MRI", Magnetic Resonance in Medicine, vol. 42, (1999) pp. 952-962.

Murphy et al. "Fast I1-SPIRiT Compressed Sensing Parallel Imaging MRI: Scalable Parallel Implementation and Clinically Feasible Runtime," IEEE Tran. on Med. Imaging, vol. 31, No. 6 (2012) pp. 1250-1262.

Liu et al. "G-factor Maps of Conjugate Gradient SENSE Reconstruction", ISMRM (2008) p. 1285.

Lustig et al. "Sparse MRI: The Application of Compressed Sensing for Rapid MR Imaging", Magnetic Resonance in Medicine, vol. 58, (2007) pp. 1182-1195.

Griswold et al. "The Use of an Adaptive Reconstruction for Array Coil Sensitivity Mapping and Intensity Normalization", Proc. Intl. Soc. Mag. Reson. Med. vol. 10 (2002).

* cited by examiner

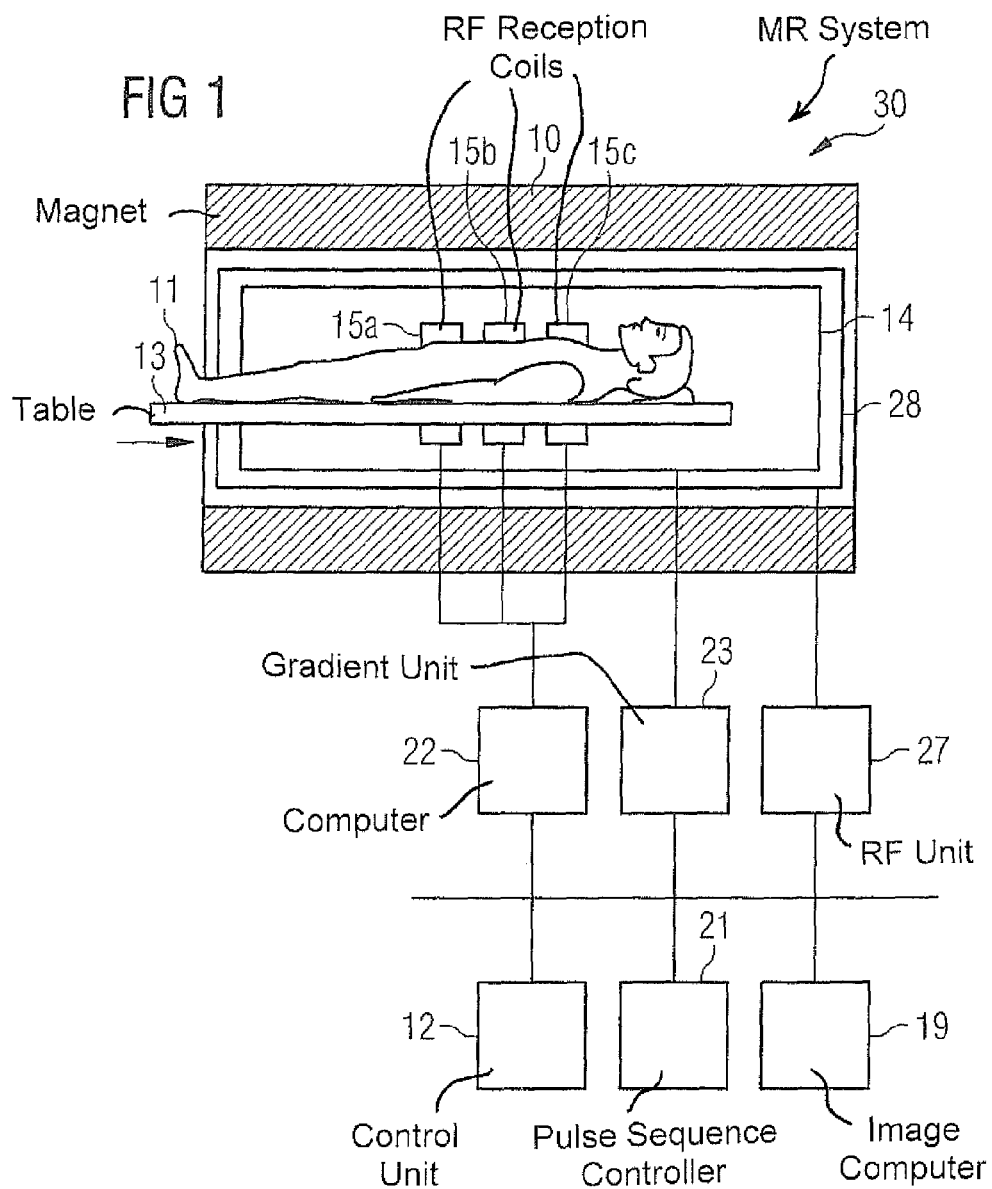
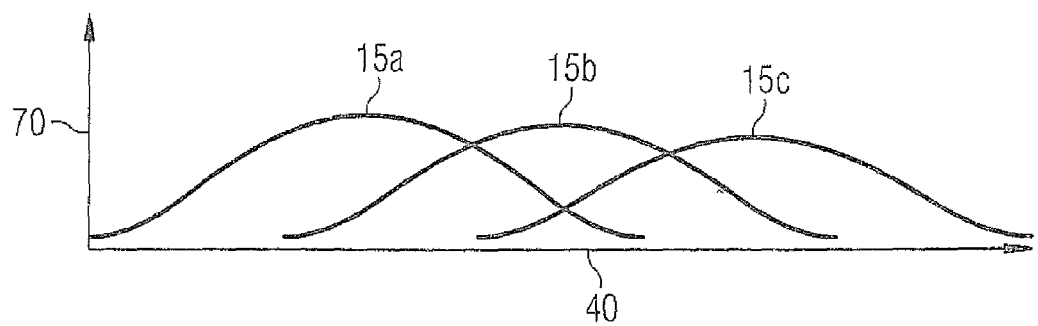

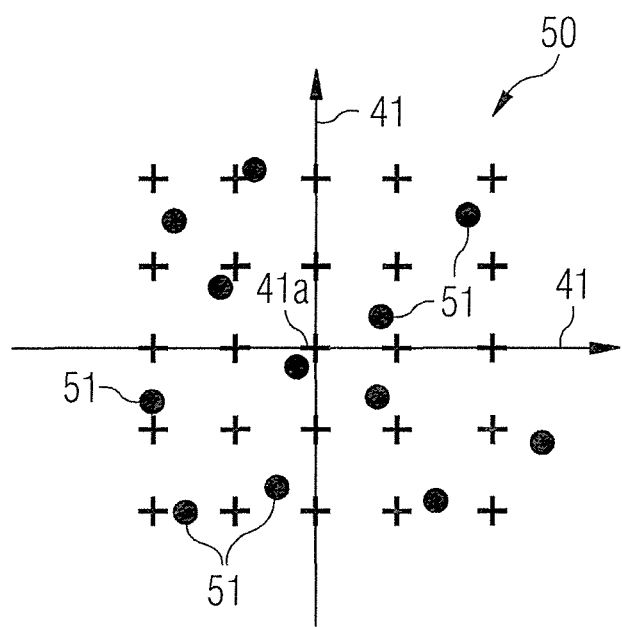

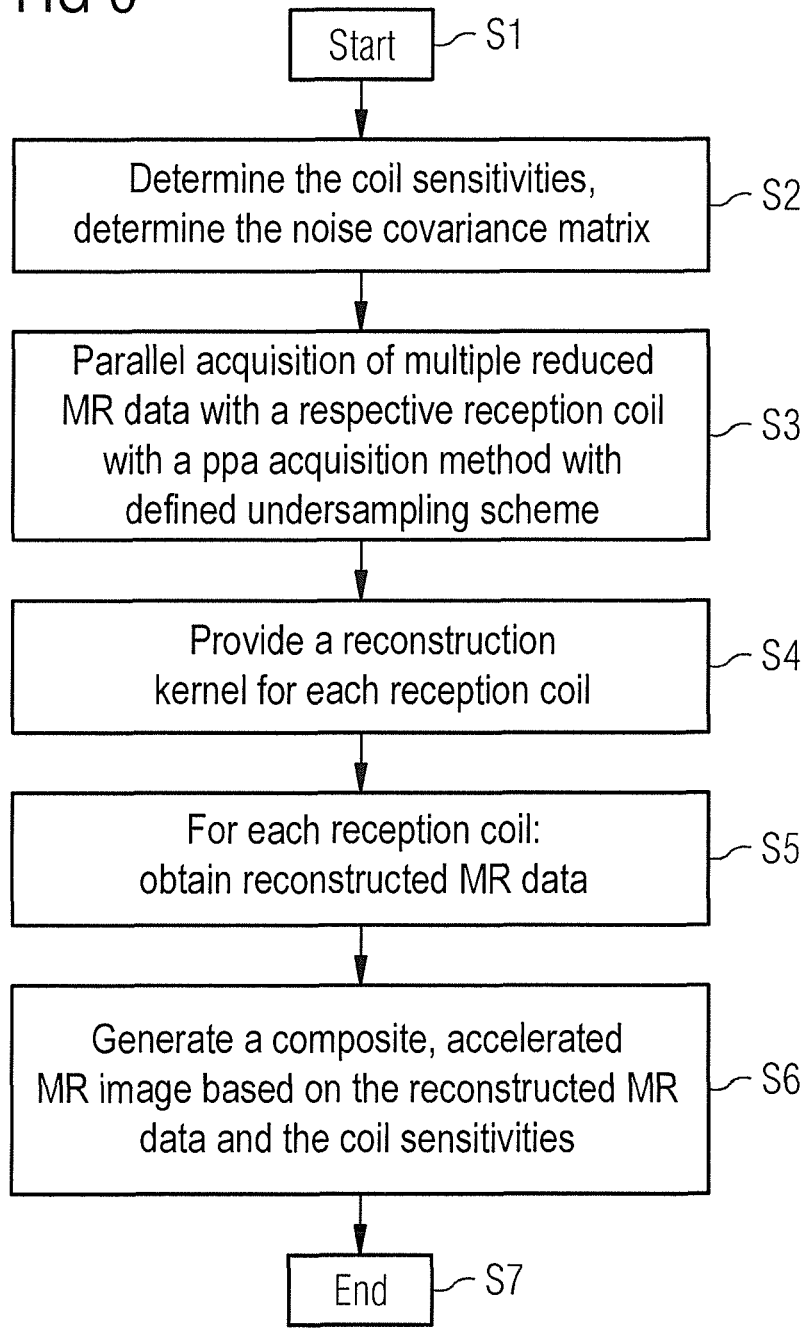

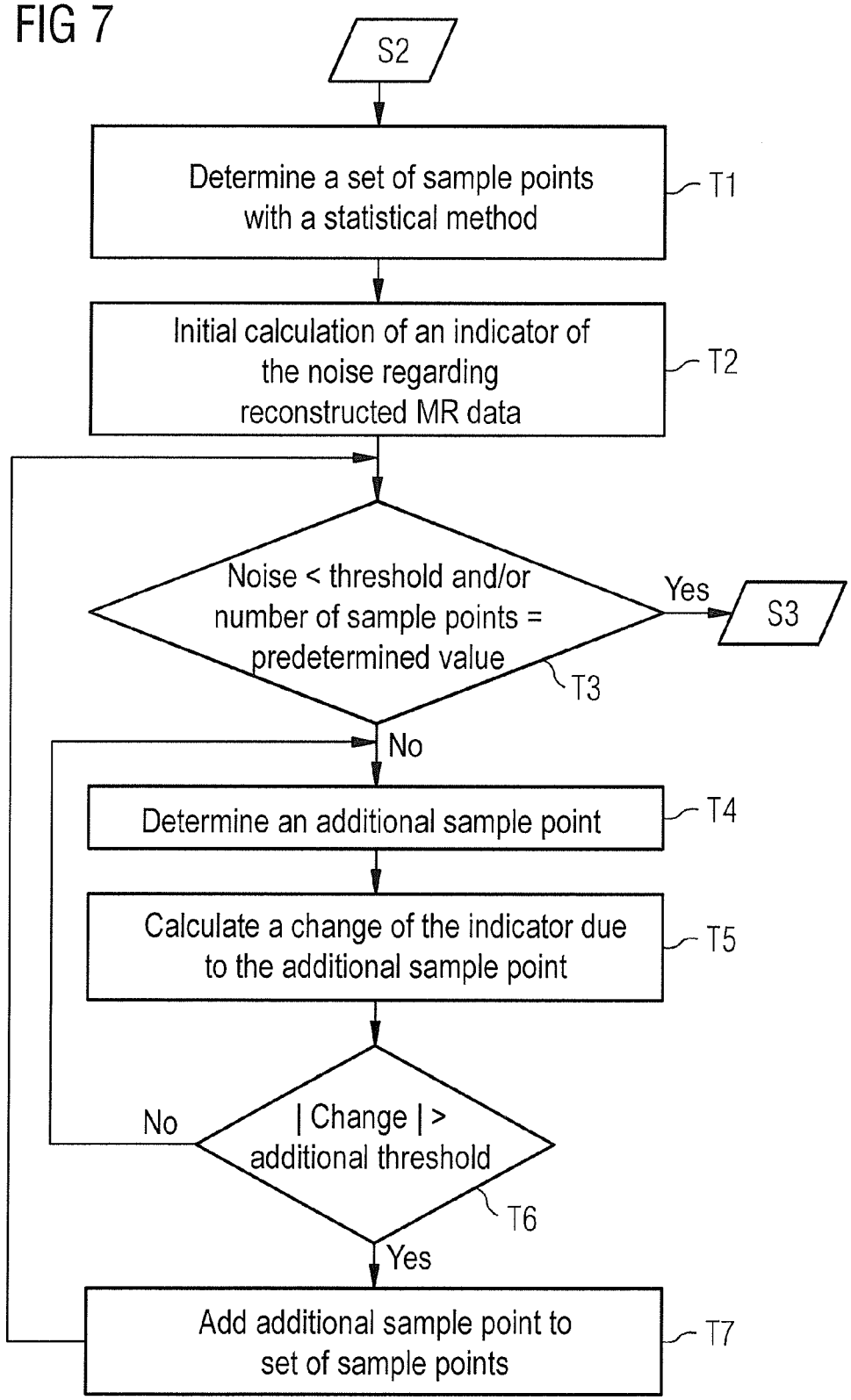

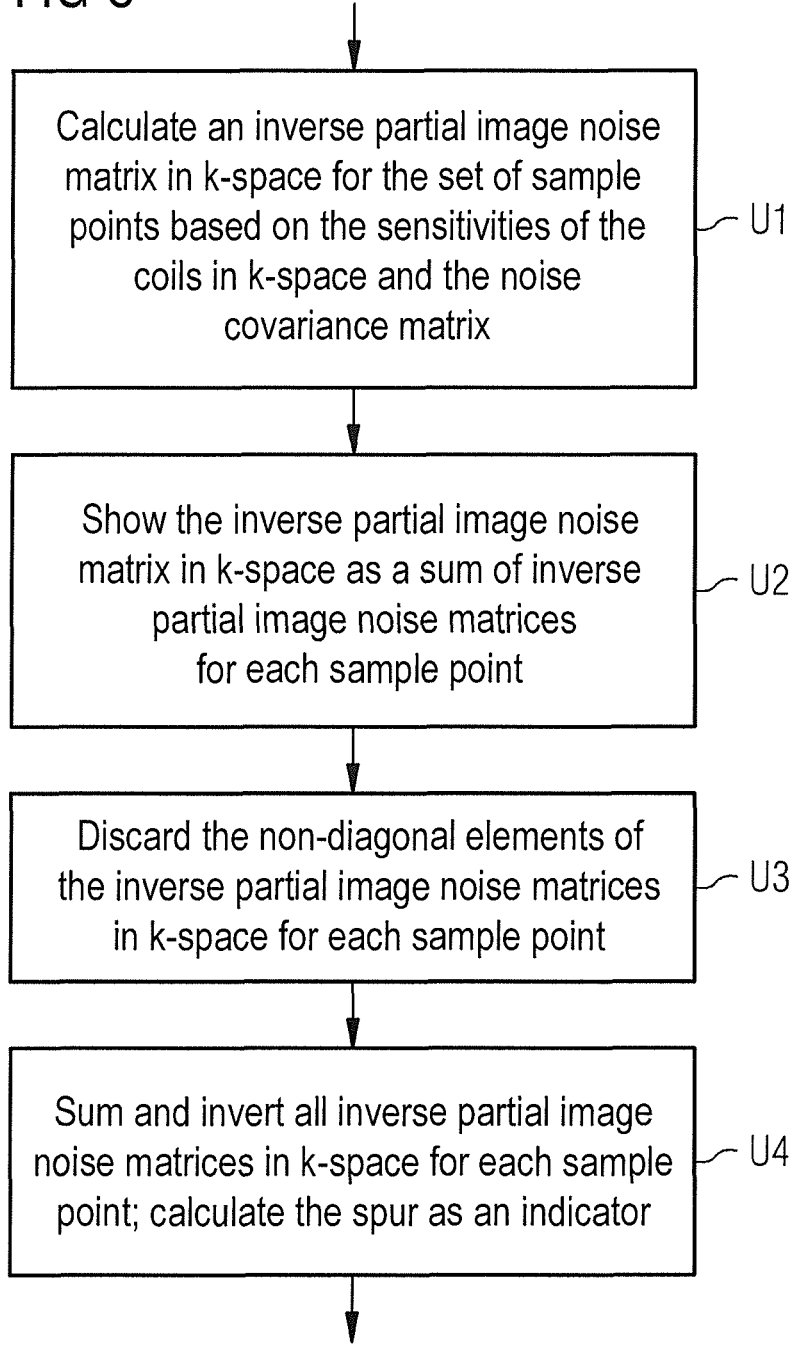

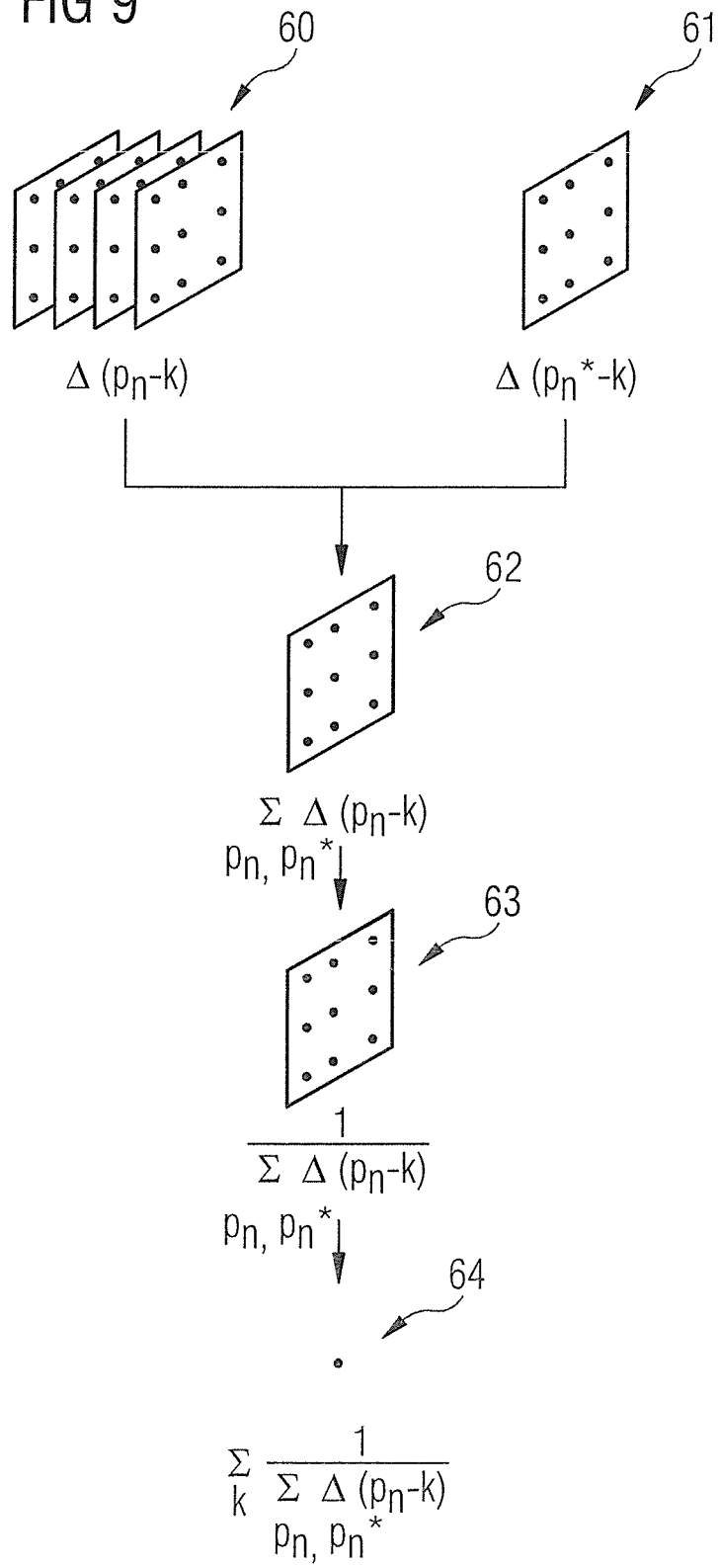

METHOD AND MAGNETIC RESONANCE SYSTEM THAT DETERMINES OPERATIONAL SAMPLE POINTS IN K-SPACE OF A RANDOM UNDERSAMPLING SCHEME WHEN ACQUIRING MAGNETIC RESONANCE DATA

BACKGROUND OF THE INVENTION

Field of the Invention

The present invention concerns a method for acquiring magnetic resonance image data that is entered into k-space at sample points in k-space with a random undersampling scheme, as well as a magnetic resonance tomography apparatus for implementing such a method.

Description of the Prior Art

Magnetic resonance tomography (MRT) is an imaging method that enables the acquisition of two-dimensional or three-dimensional image data sets that can depict structures inside an examined person with high resolution. In MRT, the magnetic moments of protons in an examination subject are aligned in a basic magnetic field or primary magnetic field (B0) so that a macroscopic magnetization arises. This is subsequently deflected out of the steady state, parallel to the basic magnetic field, via the radiation of radio-frequency (RF) pulses. Special RF transmission coils are typically used for radiation.

The decay of the excited magnetization back into the steady state or the magnetization dynamic is subsequently detected by means of one or more RF reception coils. A spatial coding of the acquired magnetic resonance (MR) data is hereby achieved via the application of various magnetic field gradients (for slice selection, phase coding or frequency coding). The data that are acquired and spatially resolved in such a manner initially exist in a spatial frequency domain (k-space) and can be transformed into the spatial domain (image space) via a subsequent Fourier transformation. K-space can be scanned with different trajectories by the targeted switching (activation) of the magnetic field gradients, wherein a conventional scanning includes the successive acquisition of frequency-coded k-space lines (that are generally oriented along the x-axis of k-space) for different phase codings (that define the y-axis of k-space).

In order to reduce the acquisition duration—for example in the acquisition of MR data of a freely breathing examination subject—different methods are proposed that, on the one hand, enable an acceleration of the acquisition by the parallel usage of multiple coils with respectively limited field of view; on the other hand, they undersample k-space, i.e. omit k-space lines or individual k-space points that are to be sampled, for example. Examples of such techniques are the "Generalized Auto-Calibrating Partial [sic] Parallel Acquisition" (GRAPPA), "Sensitivity Encoding" (SENSE) and "Simultaneous Acquisition of Spatial Harmonics" (SMASH) imaging methods, which are also generally designated as partially parallel acquisition (ppa) methods. These and further methods are known from "SMASH, SENSE, PILS, GRAPPA" by M. Blaimer et al. in Top. Magn. Reson. Imaging 15 (2004), 223, for example.

In general, the undersampling of k-space takes place by means of a ppa method according to the requirements of an undersampling scheme for various sampling points. Reduced MR data are acquired for these sampling points with multiple different RF reception coils. The missing data—i.e. unsampled k-space points, for example—are reconstructed directly or indirectly from the correlation between the reduced MR data of the various RF reception coils, such that reconstructed MR data are obtained from the reduced MR data. These no longer have omitted k-space points. For this purpose, an anti-aliasing (in image space, for instance) of the superimposed, reduced MR data of the various RF reception coils and/or a reconstruction kernel that is applied to the reduced MR data can be used. For example, in GRAPPA-like methods, a reconstruction kernel can be used; in SENSE-like methods, the model assumption can be used that each coil image can be described as a product of magnetization image and coil sensitivity. Particularly in GRAPPA-like ppa methods, the reconstructed MR data can exist for every RF reception coil. However, a single accelerated data set—known as accelerated MR data—can be obtained from the reconstructed MR data. An MR image which can be used for medical diagnosis or to determine physical measurement values (volumes of organs etc.), for example, can be directly obtained from the accelerated MR data. In SENSE-like ppa methods, for example, the reconstructed MR data can already be present as an MR image in image space. It should be understood that the different MR data—i.e. reduced, reconstructed and accelerated data—can have different information levels or, respectively, can respectively be shown in image or positional frequency space depending on the specific type of ppa acquisition method (for example SENSE or GRAPPA). The corresponding techniques are known to those skilled in the art, such that it is not necessary to present details more closely here.

In general, different reconstruction algorithms allow a random undersampling scheme in which the sample points are randomly or statistically distributed in k-space, for example. This in particular applies to "Conjugate Gradient SENSE" (CG-SENSE), which is an extended PPA acquisition method building on conventional SENSE. Details in this regard are known from "Advances in Sensitivity Encoding With Arbitrary Space Trajectories" by K. P. Pruessmann et al., Mag. Reson. Med. 46 (2001) 638-651. Furthermore, an undersampling by means of the SPIRIT method is known; see in this regard "SPIRiT: Iterative self-consistent parallel imaging reconstruction from arbitrary k-space" by M. Lustig and J. M. Paul in Mag. Reson. Med. 64 (2010) 457-471. For example, it is possible to create random undersampling schemes by means of the Poisson disc distribution. The Poisson disc technique designates a known method that allows sample points of the undersampling scheme to be selected such that they have a statistical distribution and such that it is simultaneously ensured that adjacent sample points do not fall below a minimum distance, at least on average. An undersampling scheme with uniformly and randomly distributed sample points is achieved as a result.

Ppa methods are characterized by a phenomenon known as noise amplification. This means that the noise in the MR images (image noise) can be greater than the signal noise in the raw MR data (thus the reduced MR data). In particular, the reconstructed MR data can have relatively large physical uncertainties or errors (thus signal noise) since the application of the reconstruction kernel can amplify the noise. For example, the noise of the reconstructed MR data can be proportional or equal to the image noise. The image noise is a technically relevant parameter. It is significant for the quality of the MRT result and can allow diagnostics or continuative processing with determinable uncertainties or confidence values to be implemented using the MR images.

In principle, the calculation of the noise amplification (i.e. the calculation of the image noise) for an undersampling scheme is possible; see in this regard Equation 20 from "SENSE: Sensitivity Encoding for FAST MRI" by K. P. Pruessmann et al. in Mag. Reson. Med. 42 (1999) 952-962, for instance. However, such a calculation is numerically complex and requires the inversion of a matrix with the dimension of the complete k-space. Therefore, in practice it can also be possible to a limited extent to evaluate a specific undersampling scheme in this regard before acquisition of the reduced MR data and reconstruction of the reconstructed MR data. Computing capacities and available computing time can be limited in practice. Moreover, conventional ppa methods have the disadvantage that no optimization or only a slight optimization with regard to the reduced image noise is possible based on the hard-set undersampling scheme, or an undersampling scheme created according to fixed statistical criteria (for example Poisson disc distribution). With such an undersampling, in practice, parameters are absent which could be optimized with regard to a reduction of the image noise.

SUMMARY OF THE INVENTION

Therefore, there exists a need to provide ppa methods with random undersampling scheme with minimized image noise, and it is an object of the present invention to do so.

According to one aspect of the invention, a method to determine sample points of a random undersampling scheme of k-space, in order to acquire reduced magnetic resonance (MR) data with multiple coils, includes the determination of a set of sample points of the random undersampling scheme to acquire the reduced MR data and the calculation of an indicator of a signal noise in reconstructed MR data. The reconstructed MR data are suitable for use in order to reconstruct an MR image from the reduced MR data. The method furthermore includes the determination of an additional sample point that is not included in the set of sample points, and the calculation of a change of the indicator that results by the additional of the further sample point to the set of sample points. Furthermore, the method includes the selective addition of the further sample point to the set of sample points based on the calculated change and the acquisition of the reduced MR data for the set of sample points, respectively with the multiple coils, as well as the generation of reconstructed MR data from the reduced MR data of the multiple coils.

For example, such a method can be implemented with an MR system. In one MR system, the multiple coils can be special RF reception coils. These RF reception coils can be arranged along an examination region of an examination subject and therefore have a maximum of the sensitivity at different spatial positions.

The determination of the set of sample points and the determination of the additional sample point can also occur, for example, by means of a technique to determine sample points that are distributed randomly and advantageously uniformly in k-space, thus by means of a statistical method. Corresponding techniques—for example a purely stochastic distribution, the Poisson disc arrangement or what is known as a "jittered" arrangement etc.—are known to those skilled in the art.

The reconstruction of the reconstructed MR data from the reduced MR data can occur by means of extensions of known techniques such as SMASH, SENSE or GRAPPA, for instance CG-SENSE or SPIRiT. In GRAPPA-like methods (in particular SPIRiT), for this a reconstruction kernel is generally applied to the reduced MR data. In SENSE-like methods (in particular CG-SENSE), a reconstruction can be achieved with knowledge of the coil sensitivities. Corresponding techniques to obtain the reconstruction kernel or to reconstruct the reconstructed MR data are known to those skilled in the art.

The signal noise can enter into the reconstructed MR data as an additional criterion for the determination of the set of sample points (i.e. of the undersampling scheme) via the selective addition of the additional sample point depending on the calculated change of the indicator. The signal noise in the reconstructed MR data can be a direct measurement of the image noise of MR images; for example, it can be possible that the reconstructed MR data already correspond to the MR images (for instance in the case of SENSE-like ppa methods). However, it is also possible for the MR images to be obtained from the reconstructed MR data without additional noise amplification. The signal noise therefore has a technical relevance to the reconstructed MR data with regard to usability and significance of measurement data or uncertainties of physical measurement values (for instance organ volumes, tumor positions, etc.) that are derived from MR images.

In general, techniques are known to those skilled in the art to calculate or estimate the image noise or the signal noise of the reconstructed MR data before the actual and relatively time-intensive acquisition and reconstruction. For example, such techniques are known from the publications by K. P. Pruessmann that have already been cited. A noise-reduced, random undersampling scheme can thus be achieved by using those sample points that produce a comparably larger reduction of the signal noise in the reconstructed MR data.

For example, the selective addition can occur depending on a threshold comparison of the calculated change with a predetermined change threshold. For example, the additional sample point can then be added directly to the set of sample points when a magnitude of the change of the indicator is greater than a predetermined change threshold. For example, the change threshold can be dependent on the number of sample points in the set of sample points. For example, this can mean that the change of the signal noise per additionally added additional sample point turns out to be less when a greater number of sample points is present in the set of sample points. The predetermined change threshold can be adapted accordingly. It should be understood that the concrete values or orders of magnitude of the change of the indicator or of the change threshold are dependent on the concrete parameters of the undersampling scheme or the reconstruction.

In other words, the additional sample point can be viewed as a candidate for the expansion of the set of sample points. If it is calculated that the image noise can be sufficiently strongly reduced via the addition of the candidate sample point, the candidate sample point can be incorporated into the set of sample points. Otherwise, a new candidate sample point can be determined by a suitable method, for which the corresponding check is conducted again.

In this regard, the method can furthermore include the addition of the calculated change of the indicator to said calculated indicator in order to update the indicator when the additional sample point is added to the set of sample points. The determination of the additional sample point, the calculation of the change of the indicator, the selective addition of the additional sample point to the set of sample points and the addition of the calculated change of the indicator are conducted for various additional sample points until the indicator indicates a signal noise in the reconstructed MR data that is lower than a signal noise threshold and/or until a number of sample points of the set of sample points is equal to a predetermined number, and wherein the acquisition of the reduced MR data and the reconstruction of the reconstructed MR data subsequently occur.

In other words: additional noise-optimized sample points are iteratively added to the set of sample points as long as the signal noise in the reconstructed MR data has not fallen below the signal noise threshold. It can thus be ensured that the image noise lies within an acceptable range while simultaneously enabling a low number of sample points in a fast MR measurement. This enables a specific value of the signal noise (for example a value identified as the maximum acceptable value) in the reconstructed MR data for the random undersampling scheme to not be exceeded, while at the same time the number of sample points in the set of sample points remains as small as possible. For example, the number of sample points in the set of sample points can namely be proportional to a time required to acquire the reduced MR data. It can be worthwhile to reduce this required time.

In other words: the iterative evaluation and addition of additional sample points takes place until a termination criterion with regard to the image noise is achieved. An additional possible termination criterion would be the number of sample points in the set of sample points or, respectively, a maximum time for the subsequent acquisition of the reduced MR data. These termination criteria can also be combined so that the first to arrive triggers the termination, for example.

In a simple embodiment, the termination criterion can be solely the reaching of the predetermined number of sample points in the set of sample points. For example, it can namely be worthwhile to always implement the acquisition of the reduced MR data in consistent time intervals. This can allow a particularly advantageous implementation of the system control of the corresponding MR system.

For example, in comparison to known techniques that evaluate complete sets of sample points with regard to the image noise of the MR images, a reduction of the required computing power for pre-calculation of the image noise can be achieved by the iterative evaluation and selective addition of individual additional sample points. This allows the determination of the random undersampling scheme that is used to take place in a smaller amount of time. This can increase the patient comfort due to a reduced duration of the MR measurement, for example. At the same time, this can produce a cost reduction since more MR measurements can be implemented with a system per time period.

The method can furthermore include the determination of sensitivities of the coils and the determination of a noise covariance matrix via measurement of a signal noise of signals of the multiple coils. The calculation of the indicator can occur based on the specific sensitivities and the specific noise covariance matrix.

The noise covariance matrix quantifies the noise and noise correlations between the raw MR data, i.e. the reduced MR data. It should be understood that the noise covariance matrix does not need to be determined using the acquired reduced MR data, although it can also be determined using these. For example, it is also possible to implement the noise covariance matrix without spatial coding in a particularly fast calibration routine before the actual acquisition of the reduced MR data. Not only the variances of the reduced MR data themselves but also correlations between the reduced MR data of the multiple coils can be detected with such a noise covariance matrix. For example, the noise can be described approximately by white noise.

The sensitivities of the coils can in particular be determined by positional space sensitivities, i.e. an association of the sensitivity of the coils with specific positional space positions relative to the examination region. For example, it can be possible to measure the positional space sensitivities. By default the positional space sensitivities are determined in defined ppa acquisition methods; SENSE would be an example of this. Alternatively, previously stored sensitivities can be used. Optionally, it can be possible to subsequently obtain the sensitivities in k-space by means of a Fourier transformation. The determination of the indicator based on the defined sensitivities and the noise covariance matrix can take place in positional space, for example. Here the technique according to Equation 20 from "SENSE: Sensitivity Encoding for FAST MRI" by K. P. Pruessmann et al. in Mag. Reson. Med. 42 (1999) 952-962 would also be a possibility.

For example, in a modification this possibility can contain a projection P of the coil sensitivities C at the respective sample points of the undersampling scheme and the calculation of the spur Tr.

$$\sigma^2 Tr[[C^H P^H \Psi^{-1} PC]^{-1}] \tag{1}$$

therefore results for the indicator $\sigma^2$, wherein $\Psi$ is the noise covariance matrix. This expression for the indicator can be understood as the sum of the variance of each pixel of the MR image. It should also be understood that this expression is a measure of the summed squared g-factor for decorrelated MR data, wherein the coil sensitivities for each pixel would be normalized in such an expression. This can motivate to what extent the indicator according to Equation (1) can be assessed as a measure of the image noise or the signal noise of the reconstructed MR data.

A calculation of the indicator or the change of the indicator by means of the expression from Equation 1 is possible but can be computationally intensive. For example, it can be desired to acquire MR images for three-dimensional volumes. This means that a large number of image points of the MR image are present. Each image point represents a voxel, i.e. a defined measurement volume of 3D space, for example on the order of 1 mm$^3$. The inversion of the matrix that is necessary according to Equation 1 can be computationally intensive for a large number of image points. For example, if a particularly high precision is desired in the calculation of the indicator or, respectively, the calculation of the change of the indicator, it can be advantageous to implement a calculation according to Equation 1. For example, for this a correspondingly designed MR system can have particularly high computing capacities.

In a preferred embodiment of the present invention, however, it can be desirable to implement a simplified calculation of the indicator or, respectively, the change of the indicator. The simplified calculation can hereby require less cost in computing capacities. Techniques that allow such a simplified calculation are described in the following.

Furthermore, the method can include the calculation of an inverse partial image noise matrix in k-space separately for the set of sample points and for the additional sample point from the defined sensitivities of the coils and from the specific noise covariance matrix, and the discarding of those elements of the inverse partial image noise matrices in k-space for the set of sample points and for the additional sample point that correspond to k-space locations which have a distance from the k-space center that is greater than a threshold. The calculation of the change can include the summation of the inverse partial image noise matrix in k-space for the set of sample points and for the additional sample point and the inversion of the summed, inverted partial image noise matrix in k-space.

The calculation of a partial image noise matrix in the spatial domain is known to those skilled in the art, for example from the aforementioned publications by Pruessmann et al. However, it can be possible to present the partial image noise matrix in k-space, at least due to the invariance of the tracking from Equation 1 under unitary transformations. Corresponding techniques (for instance a Fourier transformation) are known to those skilled in the art.

A corresponding expression of the inverse partial image noise matrix in k-space can be written as:

$$[c^H p^H \Psi^{-1} pc](k,q), \quad (2)$$

where k, q designate the coordinates in k-space, and wherein c and p designate the coil sensitivities and projections of these on the undersampling scheme in k-space.

The discarding of those sample points in the inverse partial image noise matrices that have a comparably larger distance from the k-space center (k=0) (greater than the threshold, for example) can be motivated according to the following: the coil sensitivities of the RF reception coils in positional space typically have only a slight or weak positional spatial dependency; this means that the coil sensitivities vary less or little as a function of the position. In other words: the RF reception coils have a relatively low spatial selectivity of the sensitivity. This can in turn have the effect that the sensitivities in k-space have a particularly pronounced maximum near the k-space center. Those contributions of the inverse partial image noise matrices with large distance from the k-space center can therefore have a comparably low value due to the low coil sensitivities. Therefore, it can be possible to discard such entries of the inverse partial image noise matrices. In one embodiment of the invention, all non-diagonal elements of the inverse partial image noise matrices can be discarded in k-space. It can then be particularly simple to implement an inversion of the now diagonally inverse partial image noise matrices.

A particularly simple calculation of the change of the indicator can take place via the separate calculation of the inverse partial image noise matrices for the set of sample points or, respectively, for the additional sample point. For example, it can be possible to reimplement the summation of the inverse partial image noise matrix only for the set of sample points and for the additional sample point, and to not implement a complete reimplementation of the inverse partial image noise matrix for the set of sample points. For example, the latter can be cached. However, in a simple embodiment also the inverse partial image noise matrix for each sample point of the set of sample points is provided.

The method can then include the calculation of an inverse partial image noise matrix for each sample point from the set of sample points. Furthermore, the method can include the formation of an inverse diagonal partial image noise matrix in k-space for each sample point from the set of sample points by discarding non-diagonal elements of the inverse partial image noise matrix in k-space for the respective sample point, and finally the addition of the inverse diagonal partial image noise matrix in k-space for all sample points of the set of sample points in order to obtain the diagonal inverse partial image noise matrix in k-space for the set of sample points.

Assuming Equation 2, this "pushing" of the different sample points $p_n$ through the inverse partial image noise matrix can be represented as:

$$[c^H p^H \Psi^{-1} pc](k, q) = \sum_{p_n} \Delta(p_n - k, p_n - q), \quad (3)$$

wherein here the matrix $\Delta$ was introduced:

$$\Delta(p,q) = \Sigma_{i,j} c_i^H(p) \Psi_{ij}^{-1} c_j(q) \quad (4)$$

The sum extends over all coils i, j, and p, q designate k-space locations.

As can be seen from Equation 3, the inverse partial image noise matrix can be shown for the set of sample points $\{p_n\}$ or, respectively, for the additional sample point (designated in the following with $p_n^*$). The calculation of the change of the indicator can then be kept comparably less costly via the calculation of the corresponding summand of the sum from Equation 3 for $p_n^*$.

The diagonal inverse partial image noise matrix can be produced by discarding the non-diagonal elements of the individual matrices $\Delta$ before the summation into the inverse partial image noise matrix for the set of sample points. However, it is also possible for the non-diagonal elements to be discarded after the summation.

As explained above, the matrices $\Delta$ for points far removed from the k-space center can have comparably low values. Furthermore, the matrices $\Delta$ can be positive hermetic matrices. The diagonal entries can be sums of positive numerical values while non-diagonal entries can in principle mutually cancel out. This can motivate the approximation of the discarding of non-diagonal elements. This discarding of the non-diagonal elements can be represented as $$\Delta(p,q) \approx \Delta(p) \delta_{p,q}, \quad (5)$$

wherein $\delta_{p,q}$ represents the Kronecker delta.

An additional view of the approximation of Equation 5 in connection with the calculation of the next Equations 6 and 7 can be the fact that the best result for the indicator $\sigma^2$ is obtained for the case of a diagonal of $\Delta(p, q)$ that has optimally identical entries. In this context, the procedure to minimize the indicator $\sigma^2$ can strive to cause the diagonals of the inverse partial image noise matrix distributed as uniformly as possible in k-space according to Equation 2.

Furthermore, the method can then include the inversion of the diagonal inverse partial image noise matrix in k-space for the set of sample points in order to obtain a diagonal partial image noise matrix in k-space, and additionally the calculation of the trace or spur of the diagonal partial image noise matrix for the set of sample points in k-space as an indicator.

The diagonal inverse partial image noise matrix can be represented in summary as:

$$\Xi(k) = \sum_{p_n} \Delta(p_n - k) \quad (6)$$

$$= \sum_{p_n} \sum_{i,j} c_i^H(p_n - k) \Psi_{ij}^{-1} c_j(p_n - k).$$

A particularly simple inversion can be enabled by the partial image noise matrix that can be approximately represented as a diagonal matrix in k-space, for example according to the formula $$\sigma^2 = \sum_k \left[ \sum_{p_n} \Delta(p_n - k) \right]^1. \quad (7)$$

An indicator $\sigma^2$ calculated in such a manner has the effect that no relatively large matrices (for instance matrices with a number of entries that is identical to the number of image points of the MR image) must be inverted and, moreover, the indicator calculated in such a manner has the effect that only the sum over $\{p_n\}$ must be expanded before the inversion over the additional summands concerning the additional sample point $p_n^*$ to calculate the change of the indicator.

Both effects can produce a reduced computing cost in the calculation of the indicator and the calculation of the change of the indicator. This allows the determination of a noise-reduced, random undersampling scheme just before an MR measurement within the scope of a calibration routine, for example. Based on the actual placement of the different coils (and therefore also on the measured positional space sensitivities or the actual measured noise covariance matrix), an individually optimized, noise-reduced undersampling scheme can be determined for a specific arrangement.

The calculation of the change of the indicator for the additional sample point can accordingly occur in a manner analogous to the above embodiment regarding the calculation of the indicator for the set of sample points.

The calculation of the change of the indicator can occur based on the defined sensitivities and the defined noise covariance matrix, and the calculation of the change of the indicator can include: calculate an inverse partial image noise matrix in k-space for the additional sample point from the defined sensitivities of the coils and from the defined noise covariance matrix; calculate a diagonal inverse partial image noise matrix in k-space for the additional sample point by discarding non-diagonal elements of the inverse partial image noise matrix in k-space; and add the diagonal inverse partial image noise matrix in k-space for the additional sample point to the inverse diagonal partial image noise matrix in k-space for all sample points of the set of sample points in order to obtain a modified diagonal inverse partial image noise matrix in k-space for the set of sample points with the additional sample point.

For example, it is then be possible to calculate a modified indicator (as presented in the preceding) from the modified diagonal inverse partial image noise matrix in k-space. The difference between the modified indicator and the indicator with regard to the set of sample points can then designate the change of the indicator.

The formation of the diagonal inverse partial image noise matrix $\Xi^*$ for the additional sample point $p_n^*$ in k-space can then occur according to the following formula:

$$\Xi*(k) = \Delta(p_n*-k) \quad (8)$$
$$= \sum_{i,j} c_i^H(p_n*-k)\Psi_{ij}^{-1}c_j(p_n*-k).$$

This Equation 8 results from Equation 6, which is limited to the additional sample point $p_n^*$.

In general, the image noise can continuously decrease with the number of sample points in the set of sample points. Therefore, it can be worthwhile to provide the indicator normalized to the number of sample points of the set of sample points. This can include a division of the expression of Equation 7 by the number of sample points, i.e. a power of the set $\{p_n\}$.

Furthermore, for an approximation according to Equation 5 it can be worthwhile to set a positional spatial dependency of the coils so that a sensitivity of the coils in the k-space center has a defined relationship to a sensitivity of the coils at non-central k-space locations. In particular, it can be worthwhile to set the sensitivities of the coils in positional space so that the coils have a comparably low dependency on the location. Namely, the entries of the inverse partial image noise matrix in k-space near the k-space center can be especially large in comparison to non-central k-space locations. The cited approximations—i.e. the discarding of the non-diagonal elements according to Equation 5, for example—can then produce particularly small inaccuracies.

The invention also encompasses a method to calculate an indicator of a signal noise in reconstructed MR data, wherein the reconstructed MR data are reconstructed from reduced MR data, and wherein the reduced MR data are acquired with multiple coils using a random undersampling scheme. The method includes the determination of sensitivities of the coils and the determination of a noise covariance matrix via measurement of correlations and/or self-correlations of a signal noise of signals of the multiple coils. The method furthermore includes the formation of an inverse partial image noise matrix in k-space for a set of sample points from the defined sensitivities of the coils, and from the defined noise covariance matrix and the discarding of the non-diagonal elements of the inverse partial image noise matrix in k-space for the set of sample points in order to obtain an inverse diagonal partial image noise matrix. The method furthermore includes the inversion of the inverse diagonal partial image noise matrix in k-space for the set of sample points in order to obtain a diagonal partial image noise matrix in k-space for the set of sample points, and the calculation of a spur of the diagonal partial image noise matrix in k-space for the set of sample points as an indicator.

The discarding of the non-diagonal elements to obtain the inverse diagonal partial image noise matrix in k-space for the set of sample points can furthermore include: form an inverse partial image noise matrix in k-space for each sample point from the set of sample points; and form a diagonal inverse partial image noise matrix in k-space for each sample point from the set of sample points by discarding non-diagonal elements of the inverse partial image noise matrix in k-space for the respective sample point; and add the diagonal inverse partial image noise matrix in k-space for all sample points of the set of sample points in order to obtain the diagonal inverse partial image noise matrix in k-space for the set of sample points.

This can correspond to the calculation of the indicator according to Equations 6 and 7.

The method to calculate the indicator noted immediately above achieves advantages that correspond to those that can be achieved with the inventive method to determine sample points discussed earlier.

The invention also encompasses an MR system that has a computer, an image computer and a pulse sequence controller. The pulse sequence controller is designed or configured to implement the following steps: determine a set of sample points of the random undersampling scheme to acquire the reduced MR data, and calculate an indicator for a signal noise in reconstructed MR data, wherein the reconstructed MR data are suitable in order to be reconstructed from the reduced MR data; and determine an additional sample point which is not included in the set of sample points; and calculate a change of the indicator that results via an addition of the further sample point to the set of sample points; and selective addition of the additional sample point to the set of sample points based on the calculated change. Furthermore, the computer is designed to implement the following step: acquire the reduced MR data for the set of sample points, respectively with the multiple coils. Furthermore, the image computer is designed to implement the following step:

reconstruct the reconstructed MR data from the reduced MR data from the reduced MR data of the multiple coils.

In summary, the MR system according to the invention is configured to implement a method to determine sample points of a random undersampling scheme and/or a method to calculate an indicator for a signal noise according to the invention described above. Advantages that correspond to those achieved by these methods can then be achieved for the MR system according to the invention.

The features presented above and features that are described in the following can be used not only in the corresponding, explicitly presented combinations but also in additional combinations or in isolation, without departing from the scope of the present invention.

BRIEF DESCRIPTION OF THE DRAWINGS

FIG. 1 schematically illustrates a magnetic resonance system that is configured to implement a method according to the invention, but otherwise conforms to known systems.

FIG. 2 shows positional space sensitivities of radio-frequency reception coils for explaining the invention.

FIG. 5 illustrates a random undersampling scheme with sample points in k-space.

FIG. 6 is a flow diagram of a known GRAPPA-like ppa method.

FIG. 7 is a flow diagram of a method according to the invention to determine a random undersampling scheme of k-space with consideration of a precalculated indicator for image noise.

FIG. 8 is a flow diagram showing parts of the method of FIG. 7 in greater detail according to a preferred embodiment of the invention.

FIG. 9 schematically illustrates inverse diagonal image noise matrices in k-space and the indicator according to an embodiment of the invention.

DESCRIPTION OF THE PREFERRED EMBODIMENTS

Figure 3:
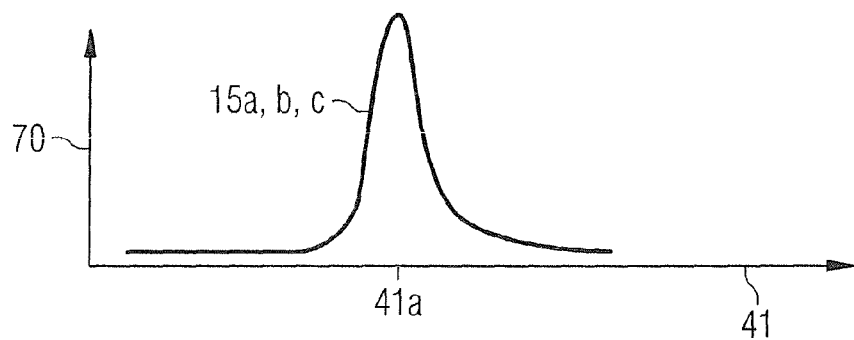
FIG. 3 shows k-space sensitivities of the RF reception coils associated with the positional space sensitivities of FIG. 2.

In the following, techniques are explained which enable a random undersampling scheme to acquire reduced MR data with reduced image noise to be determined. The image noise can be calculated in advance, i.e. before acquisition of the MR data. This can on the one hand concern techniques to determine sample points of the undersampling scheme, on the other hand also techniques for implementation of the ppa acquisition method. With regard to the figures, reference is made to reconstruction methods using a reconstruction kernel; this is in particular the case for GRAPPA-like ppa methods, in particular SPIRiT. However, it should be understood that the present invention is not limited to the determination and/or application of a reconstruction kernel. For example, for SENSE-like methods (in particular CG-SENSE) a reconstruction without reconstruction kernel can take place with knowledge of the coil sensitivities for RF reception coils. The terms "reduced MR data", "reconstructed MR data" and "accelerated MR data" should accordingly not be construed as limiting and apply to all of these techniques.

FIG. 1 schematically shows a magnetic resonance (MR) system 30 according to one embodiment of the present invention. The MR system 30 has a magnet 10 to generate a basic magnetic field. For example, the magnet 10 can be a tube magnet, and the basic magnetic field can be situated parallel to the longitudinal axis of the tube. An examination subject (here a person 11 to be examined) can be slid on a bed or table 13 into the magnet 10, as is schematically represented by the arrow. The MR system 30 furthermore has a gradient system 14 to generate magnetic field gradients that are used for the imaging and for spatial coding of acquired MR data. To excite the nuclear spins out of the polarization or alignment resulting in the basic magnetic field, an RF coil arrangement 28 is provided that can radiate an amplitude-modulated RF pulse into the examined person 11 in order to deflect the magnetization of the nuclear spins out of the steady state. To generate such RF pulses, a radio-frequency unit 27 is used that can include a radio-frequency generator and an amplitude modulation unit, for instance. A gradient unit 23 is provided to control the magnetic field gradient. The units 27 and 23 can be operated synchronously.

MR data can be obtained from the magnetization dynamics, i.e. the decay of the excited magnetization or the relaxation back into the steady state. The acquisition of MR data can take place with multiple RF reception coils 15a, 15b, 15c. These can be part of a larger coil array (for example phased array coils) that includes additional reception coils. Additional spatial information is obtained due to the spatially different arrangement of the coils, and thus the different sensitivity profiles. K-space therefore does not need to be scanned (have data entered therein) completely, and an acceleration of the acquisition of reduced MR data can be achieved by an undersampling of k-space. This is known as a ppa method. The reduced MR data can be "completed" by knowledge of and use of coil sensitivities and/or a reconstruction kernel so that reconstructed MR data are generated. The additional information for the multiple RF reception coils 15a, 15b, 15c can be used for this purpose. The RF reception coils 15a, 15b, 15c can each have a separate reception unit so that a raw data set of reduced MR data can be acquired in parallel for each reception coil. In FIG. 1, only one computer 22 is shown that is designed to acquire parallel reduced MR data of the different RF reception coils 15a, 15b, 15c.

The computer 22 can furthermore quantify the signal noise. The signal noise is the noise of the raw data, i.e. the reduced MR data, acquired from the different coils. The signal noise affects the later image noise, i.e. the actual perceived noise of the processed MR data that are present in the form of an MR image. For example, the quantification of the signal noise of the raw data or of the reduced MR data takes place via measurement of a noise covariance matrix $\Psi$ by the computer 22. In the following, the noise covariance matrix is presented as an example for two coils, for instance the RF reception coils 15a and 15b:

$$\Psi = \begin{pmatrix} \Psi_{11} & \Psi_{21} \\ \Psi_{12} & \Psi_{22} \end{pmatrix}, \tag{9}$$

wherein the diagonal elements represent the autocorrelations of the signal noise and the non-diagonal elements represent correlations of the signal noise between the different coils 15a, 15b. The above representation of the noise covariance matrix can be generalized for multiple coils. The elements of the matrix from Equation 9 can be determined in a calibration measurement, for example. The matrix from Equation 9 can be determined without dependency on the location, for example in that no gradients for spatial coding are applied by means of the gradient system 14. Due to the parallel acquisition of MR data by means of separate reception units in the computer 22, the respective coil noise remains essentially uncorrelated, meaning that the non-diagonal elements of the noise covariance matrix are small in comparison to the diagonal elements so that a better signal-to-noise ratio (SNR) can be achieved. Remaining correlations between adjacent coils can be taken into account via a pre-processing of acquired MR data in the form of a decorrelation.

The implementation of MR measurement sequences of a ppa method is centrally controlled by the pulse sequence controller 21 of the magnetic resonance system 30. The pulse sequence controller 21 controls the radiation of RF pulses, the application of gradient fields and the acquisition of the reduced MR data. A reconstruction of reconstructed MR data from the reduced MR data and a continuative processing of these takes place in an image computer 19. Via a control unit 12, an operator can select a measurement sequence protocol and enter and modify imaging parameters, for example.

Although the various components of the MR system 30 are shown and discussed as separate units in the exemplary embodiment FIG. 1, it is also possible for various components to be combined into one unit. For example, individual components can be implemented as hardware or software or as a combination of these types of components, and can be executed together or separately in one or more modules.

In FIG. 2, sensitivities 70 of the RF reception coils 15a-15c are represented as a function of location 40. For example, the location 40 can designate different positions along the longitudinal axis of the MR system 30 or, respectively, the magnet 10 (see FIG. 1). As is clear from FIG. 2, the RF reception coils 15a-15c have a maximum of the sensitivity 70 at different positions. Overall, the RF reception coils 15a-15c have a relatively low dependency of the sensitivity 70 on the position in positional space 40. This means that a change of the sensitivity 70 with the location turns out to be comparably small. For example, as is namely clear from FIG. 2 the sensitivities 70 of adjacent coils overlap in a larger range. In other words: a gradient of the sensitivities 70 of the RF coils 15a-15c assumes comparably low values.

The sensitivities 70 of the RF reception coils 15a-15c in positional frequency space 41 (k-space) are shown in FIG. 3. The representation in FIG. 3 is therefore a Fourier transformation of the representation in FIG. 2. Due to the relatively low dependency of the sensitivity on the position in positional space (see FIG. 2), the sensitivity 70 in k-space has an pronounced maximum near the center 41a of k-space 41. This means that the RF reception coils 15a-15c have large values of the sensitivity 70, in particular for small k-vectors.

Figure 4:
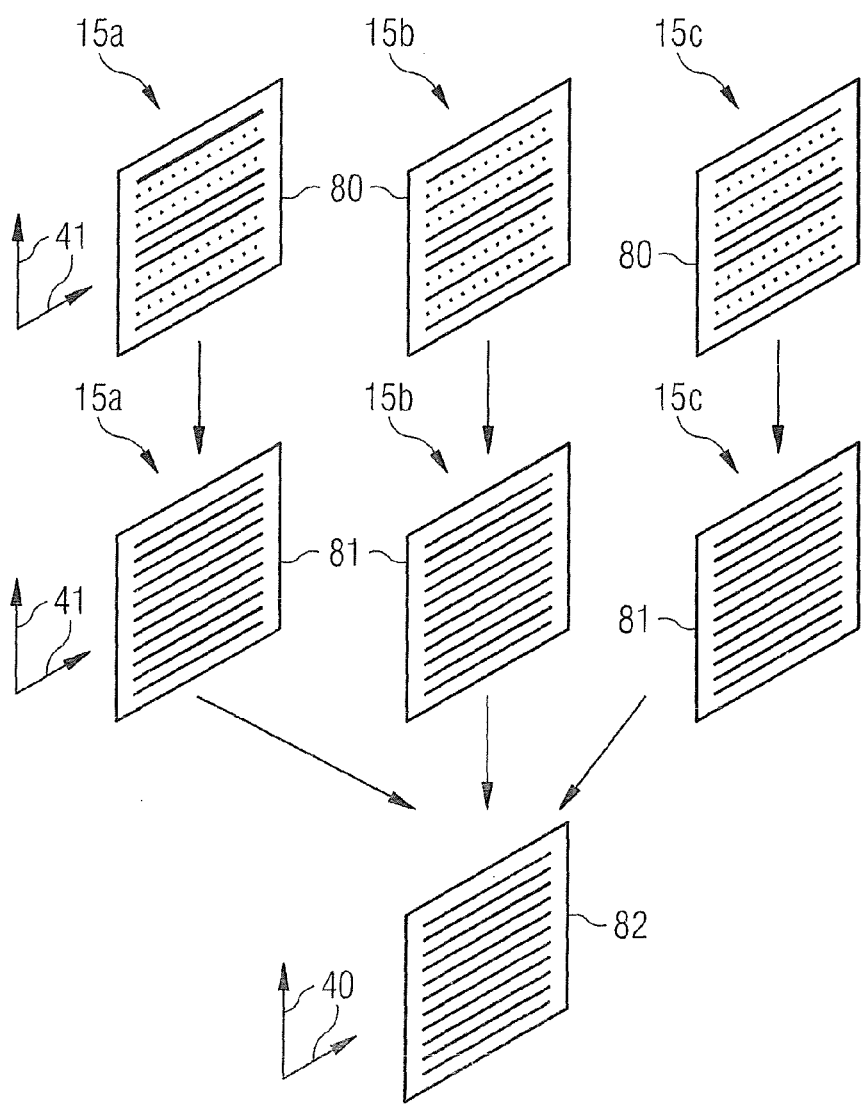
FIG. 4 schematically illustrates reduced, reconstructed and accelerated MR data for a GRAPPA-like ppa method.

As is presented with regard to FIG. 1, the pulse sequence controller 21 controls the implementation of the MR measurement sequence according to a ppa acquisition method such as SENSE or GRAPPA or, respectively, methods derived from these, in particular SPIRIT and CG-SENSE. Parallel reduced MR data 80 are thereby acquired with each of the RF reception coils 15a-15c (see FIG. 4). More than three RF reception coils 15a-15c can be used for parallel acquisition of the reduced MR data 80. The reduced MR data 80 constitute a data set for which k-space was not completely scanned (filled with data), i.e. in which k-space lines were omitted, for example (dotted lines in FIG. 4). For example, the k-space data points to be scanned are determined by the field of view to be presented and the desired resolution of the resulting image data, or using a calculated image noise. The ratio of the omitted sample points to the acquired sample points designates an acceleration factor. The precise type and manner of the scanning of k-space is designated as an undersampling scheme. For example, an undersampling scheme is characterized by the arrangement of those data points in k-space for which the MR data are acquired (known as sample points) and the number and position of omitted (empty) k-space data points. For example, if every third k-space line is measured (i.e. data are acquired therefor and entered therein), this is characterized by an acceleration factor that assumes a value of 3. It should be clear that, in addition to the omission of k-space lines (as indicated in FIG. 4), other accelerated acquisition methods exist that implement a radial or spiral-shaped scanning, for example, such that k-space is scanned with a lower density in defined regions than in other regions.

It is possible to undersample k-space with randomly arranged sample points, i.e. to use a random undersampling scheme. FIG. 5 depicts such a random undersampling scheme 50 of k-space 41. For example, the frequency coding direction is shown vertically in FIG. 5 while the phase coding direction is presented horizontally. Also shown is the k-space center 41a. The points in FIG. 5 indicate the randomly determined sample points 51 of k-space 41. For example, a method known as a Poisson disc method can be used to determine the sample points 51 in FIG. 5. With such a method, it is possible for the sample points 51 to exhibit a random or statistical arrangement (distribution) in k-space 41 but, on average, to not fall below a certain minimum distance. Suitable techniques for this are known to those skilled in the art and thus need not be explained in detail herein.

Referring again to FIG. 4 (where a fixed undersampling scheme for a GRAPPA-like ppa acquisition method is graphically illustrated as an example) it is presented how the reconstructed MR data 81 can be obtained from the reduced MR data 80. Since the acquisition of the reduced MR data 80 takes place in parallel with the RF reception coils 15a-15c, the undersampling scheme 50 is normally the same for every data set that was acquired with the various coils 15a-15c, meaning that the MR data exhibit the same gaps or omissions or missing MR data points. For GRAPPA-like ppa methods, for each coil i=1, . . . , $N_c$ it is possible to complete the respective reduced MR data 80 or $l_k^{red}$ thereof by means of a reconstruction kernel $w_{k1}$, by applying this reconstruction kernel $w_{k1}$ to $l_k^{red}$ in order to reconstruct the missing MR data. The reconstructed MR data 81 or $l_k^{acc}$ are created in such a manner for the respective coils:

$$I_k^{acc} = \sum_{i=1}^{N_c} w_{k1} \cdot I_1^{red}. \tag{10}$$

For example, the reconstruction kernel $w_{k1}$ can be represented in the form of a matrix containing elements that are known as weightings. Weightings can be calculated using calibration data sets that have a sufficiently high data point density. In FIG. 4 this is indicated above by the central k-space lines that have no (or only slight) omissions. This is the case for methods known as self-calibrating methods, among which is GRAPPA.

For other ppa methods (such as SENSE and CG-SENSE) it is also possible to obtain the reconstructed MR data 81 from the measured coil sensitivities 70. For example, in image space with overlaps. Suitable techniques are known to those skilled in the art, for example from the aforementioned publication by M. Blaimer et al.

The image computer 19 is designed to implement the acquisition of the reconstructed MR data 81 and to implement the necessary transformations between k-space 41 and image space 40. If necessary, the calculation of the combined, accelerated MR data (which can be used as an MR image 82, possibly after a transformation into the image domain 40) takes place from the reconstructed MR data 81 of the respective coils 15a, 15b, 15c.

As an expansion of FIG. 4, in FIG. 6 a flow diagram is shown which illustrates the reconstruction and combination of the reduced or, respectively, reconstructed MR data 80, 81 to obtain the MR image 82 according to a ppa acquisition method. The method begins in Step S1. The determination of the coil sensitivities 70 (See FIGS. 2 and 3) initially takes place in Step S2. Furthermore, the determination of the noise covariance matrix takes place in Step S2 (see Equation 9).

The parallel acquisition of the multiple reduced MR data 80 with a respective one of the reception coils 15a-15c subsequently takes place in Step S3 with a ppa acquisition method with a defined undersampling scheme 50. According to the invention, a random undersampling scheme 50 (see FIG. 5) is used, which includes randomly arranged sample points 51 that are defined by a Poisson disc method, for example.

Step S4 is an optional step that in particular can be used in GRAPPA-like ppa acquisition methods (for instance SPIRiT). In Step S4, the provision of a reconstruction kernel takes place for each of the RF reception coils 15a-15c (see Equation 10).

The acquisition of reconstructed MR data subsequently takes place in Step S5 for each of the RF reception coils 15a-15c. For example, this can take place for GRAPPA-like ppa acquisition methods via the application of the provided reconstruction kernel from Step S4 to the acquired, reduced MR data 80. For SENSE-like ppa methods such as CG-SENSE, for instance, this can take place using the coil sensitivities 70.

In Step S6, the generation of the MR image 82 takes place in image space 40 based on the reconstructed MR data 81 and the coil sensitivities.

In particular, it can be possible that Steps S5 and S6 are implemented in one calculation operation for SENSE-like ppa acquisition methods, for example by anti-aliasing the aliased reduced or reconstructed MR data in the image domain. See FIG. 4 of the aforementioned publication by M. Blaimer et al. in this regard, for instance.

The method ends in Step S7.

In principle, the operation of the MR system 30 according to a method as has been discussed in the preceding with regard to FIGS. 4 and 6 is known to the man skilled in the art. Therefore, there is no need to present further details with regard to the MR system 30 or, respectively, ppa acquisition method in this scope.

In the following, with regard to FIG. 7-9 techniques are presented which allow the random undersampling scheme 50 (which is characterized by the set of sample points 51) to be determined such that the MR image 82 has a reduced image noise or, respectively, the reconstructed MR data 81 have a reduced signal noise. This thus corresponds to the calculation of the noise amplification between the reduced MR data 80 and the reconstructed MR data 81. In particular, techniques are presented which allow the signal noise of the reconstructed MR data 81 to be quantified before the actual implementation of the MR measurement sequence, thus before implementation of Steps S3-S7 of FIG. 6. According to various embodiments, this can allow the set of sample points 51 to be determined such that in particular those sample points 51 which reduce the signal noise of the reconstructed MR data 81 to be added to the undersampling scheme 50.

In FIG. 7, Steps T1-T7 are presented which can be implemented between Steps S2 and S3 of FIG. 6 to determine the undersampling scheme 50, for example. The determination of a set of sample points 51 of the random undersampling scheme 50 with a statistical method initially takes place in Step S1. A suitable statistical method would be the Poisson disc distribution, for example. However, other corresponding techniques are known to those skilled in the art that supply randomly distributed sample points 51 of the undersampling scheme 50. For example, a purely stochastic distribution would be possible, or a stochastic distribution that realizes a higher density of the sample points 51 near the k-space center 41a, for example. Numerous modifications are conceivable.

The initial calculation of the indicator for the signal noise in the reconstructed MR data 81 can thereupon take place in Step T2. For example, techniques known to the man skilled in the art from the literature can be used for this. Such a technique is disclosed in the publications by K. P. Pruessmann, for example. With regard to FIGS. 8 and 9, other techniques according to the invention are subsequently presented, however, which allow a particularly less computationally intensive or, respectively, a fast calculation of the indicator in Step T2. It should be understood that the initial calculation of the indicator for the image noise of the MR image 82 can take place before the comparably time-consuming acquisition of the reduced MR data 80 has taken place. The calculation of the indicator in Step T2 is therefore an estimate of the actual image noise of MR image 82.

In Step T3 a check is made as to whether the noise (as it was determined in Step T2) is less than a predetermined threshold. If the noise is less than the predetermined threshold, the MR measurement sequence can continue with Step S3 and the following Steps as explained with regard to FIG. 6.

In an alternative embodiment, in Step T3 it can be established whether the number of points in the set of sample points is equal to a predetermined value. For example, for signal processing considerations (in order to achieve a constant acquisition time for the reduced MR data, for example), the reproducibility and the system implementation etc. it can be desirable to always acquire MR data with the same number of points.

However, if it is established in Step T3 that the noise as it was determined in Step T2 is not less than the predetermined threshold, Step T4 is implemented. The determination of an additional sample point takes place in Step T4. In particular, the additional sample point can be determined with the same statistical method that was used to determine the set of sample points in Step T1. The additional sample point is a candidate for the addition to the set of sample points 51 of the undersampling scheme 50.

The change of the indicator that is produced by the additional sample point as it was determined in Step T4 can then be calculated in Step T5. In other words, this can mean that the change of the indicator that would result if the additional sample point were actually incorporated into the set of sample points as was determined in Step T1 is calculated in Step T5.

In one embodiment, the calculation of the change of the indicator in Step T5 can essentially comprise the same calculation as was implemented in Step T2, but with the requirement that a set of sample points 51 that is expanded by the additional sample point determined in Step T4 is used instead of the set of sample points 51 determined in Step S1. In a further advantageous embodiment of the invention as it is explained in the following with reference to FIGS. 8 and 9, however, a simplified calculation that directly delivers the change of the indicator can be implemented. This can be advantageous with regard to the required computing capacities or, respectively, the computing time required to calculate the change of the indicator in Step T5.

In Step T6 it is determined whether the absolute value of the change of the indicator is greater than a determined additional threshold. Namely, if the absolute change of the indicator is greater than the determined further threshold, for example, the noise of the reconstructed MR data 81 thus decreases particularly strongly due to the addition of the further sample point to the set of sample points 51 that was determined in Step T1. Given a positive outcome of the check in Step T6, in Step T7 the additional sample point is accordingly added to the set of sample points 51. In Step S3 the check is subsequently made again as to whether the signal noise in the reconstructed MR data 81 that is induced by the indicator is less than the determined threshold.

If it is established in Step T6 that the absolute change of the indicator due to the additional sample point is not greater than the determined further threshold, the additional sample point is not added to the set of sample points 51. Steps T4 and T5 are then implemented again so that the corresponding check for a new additional sample point or, respectively, a new candidate is implemented.

It should be understood that in particular the further predetermined threshold that is used in Step T6 can be defined as a function of the present number of sample points in the set of sample points, for example. Namely, the change of the indicator can turn out to be comparably smaller per sample point for an increasing number of sample points in the set of sample points, for example. Accordingly, the criterion which determines whether an additional sample point is incorporated into the set of sample points or not can be adapted.

Furthermore, Step T3 can include additional and/or alternative termination criteria which lead to the implementation of Step S3 of FIG. 6 and the following Steps. These termination criteria can include the number of sample points in the present set of sample points 51, the acceleration factor of the undersampling scheme 50, the time required to implement Steps S3 and the following, etc.

In FIGS. 8 and 9, techniques are now presented that enable an especially less computationally intensive or, respectively, a simple calculation of the indicator in Step T2 or, respectively, the change of the indicator in Step T5. For example, from the publications by K. P. Pruessmann et al. that are referenced above it is known how the partial image noise matrix can be determined based on the sensitivities 70 of the RF reception coils 15a-15c and based on the noise covariance matrix. This is also represented in the preceding Equation 1.

With regard to FIG. 8, Step U1, it is possible to depict the inverse partial image noise matrix in k-space 41 for the random undersampling scheme 50. A corresponding notation is presented in the above Equation 2. It is significant that a Fourier transformation of the sensitivities 70 of the RF reception coils 15a-15c occurs in k-space 41. The noise covariance matrix itself has no dependency on the location and is therefore invariant under this transformation.

In Step U2 of FIG. 8 it is possible to depict the inverse partial image noise matrix in k-space 41 as a sum of the corresponding inverse partial image noise matrices of every sample point 51 of the undersampling scheme 50. This can accordingly be learned from the preceding Equations 3 and 4.

Since the sensitivities 70 of the RF reception coils 15a-15c have only a weak dependency on the position in positional space 40, and therefore a particularly pronounced maximum at the k-space center 41a (see FIGS. 2 and 3), in Step U3 it can be possible to discard the non-diagonal elements of the respective inverse partial image noise matrix in k-space for every sample point (as they were obtained in Step U2). This is the case since the discarded entries have particularly low values in comparison to the diagonal elements, as shown in the proceeding. Furthermore, the non-diagonal elements show potential mutual cancellation due to interference. The discarding of the non-diagonal elements of the inverse partial image noise matrices for all sample points is presented above in Equation 5; the inverse diagonal partial image noise matrices are obtained in such a manner for every sample point. Alternatively, for every sample point it would be possible to discard all of those entries of the inverse partial image noise matrices in k-space that have a greater distance from the k-space center than a threshold, for example.

A summation over the inverse (and advantageously diagonal) partial image noise matrices of all sample points 50 as indicated above in Equation 6 can subsequently take place. It would also be possible to exchange the order of Steps U3 and U4.

Since the diagonal inverse partial image noise matrix that is obtained in such a manner includes only diagonal elements (or only a few non-diagonal elements), it can be inverted particularly simply. Finally, the spur of the diagonal partial image noise matrix that is obtained in such a manner can be calculated. The spur is proportional to the indicator of the signal noise in the reconstructed MR data 81 or to the image noise of the MR image 82. The calculation of the spur takes place according to Equation 7. A normalization of the indicator obtained in such a manner to the number of undersampling points 51 of the undersampling scheme can possibly take place.

FIG. 9, in addition to FIG. 8, illustrates how the calculation of the indicator can take place for the set of sample points 51 of the undersampling scheme 50, as well as how the calculation of the change of the indicator can take place. The diagonal inverse image noise matrices 60 for all sample points 50 of the set of sample points are initially shown above in FIG. 9. It should be understood that the dimension of the matrix 60 is identical to the dimension of the MR image 52. For example, it is possible to store the matrices 60 for all sample points 51 of the set of sample points of the undersampling scheme separately in the computer 22, for example. It is also possible that only the sum of these matrices 60 is stored.

Shown on the right side in FIG. 9 is the diagonal inverse partial image noise matrix 61 for the additional sample point. For the additional sample point determined in Step T4 of FIG. 7, this matrix 61 can be calculated according to Equation 8, based on the sensitivities of the RF reception coils 15a-15c in k-space 41, and based on the noise covariance matrix. The matrix 61 has the same dimension as the matrix 60.

The summation of the matrix or, respectively, the matrices 60 with the diagonal inverse partial image noise matrix 61 for the additional sample point can then take place. The matrix 62 is obtained that also takes into account the additional sample point in addition to the set of sample points. This matrix can be inverted in order to obtain the diagonal partial image noise matrix 63. From the matrix 63 the spur can subsequently be calculated in order to obtain the indicator 64. The difference between the indicator 64 obtained in such a manner and an indicator calculated beforehand (without the additional sample point) indicates the change of the indicator due to addition of the additional sample point. This change quantifies the influence that the additional sample point has on the image noise of the MR image 82.

Finally, examples of results of the calculation of the indicator by means of Equations 6 and 7 are compared with the actual image noise of the MR image 82. For this, MR data that were not undersampled are retroactively thinned in order to obtain reduced MR data 80. It should be understood that subsequent results are examples for a specific system (here a 3D flash sequence with a 3 Tesla MR system 30 of the Magnetom Verio type, Siemens A G, Erlangen, Germany; using 12- and 32-channel RF reception coils and a 30-channel body matrix/spinal column coil array). This specific, exemplary reproduction of results is not to be construed as limiting.

| $R_{PE}$ | 1 | 2 | 1 | 3 | 1 |
|---|---|---|---|---|---|
| $R_{PAR}$ | 1 | 1 | 2 | 1 | 3 |
| $\sigma_{estimate}^2/N_{pixels}$ | 1; 1 | 2.00; 2.25 | 2.41; 2.27 | 3.45; 3.96 | 4.80; 4.37 |
| $\sigma_{real}^2/N_{pixels}$ | 1; 1 | 1.06; 1.53 | 1.71; 1.60 | 1.62; 20.3 | 11.7; 270. |

| $R_{PE}$ | 4 | 2 | 1 |
|---|---|---|---|
| $R_{PAR}$ | 1 | 2 | 4 |
| $\sigma_{estimate}^2/N_{pixels}$ | 5.45; 6.23 | 4.82; 4.97 | 7.39; 6.62 |
| $\sigma_{real}^2/N_{pixels}$ | 3.90; 1157. | 1.84; 5.54 | 49.5; 2814. |

This tables shows the evaluation of two different data sets for a conventional SENSE ppa acquisition method with an acceleration factor $R_{PE}$ in the phase coding direction and $R_{PAR}$ in the slice selection direction.

In order to test and validate the approximation according to Equation 6 and 7, undersampled, reduced MR data 80 were generated after the fact from completely sampled MR data using different regular Cartesian SENSE undersampling schemes 50 with 2D acceleration. The estimated indicator or $\sigma_{estimate}$ according to Equation 7 and the actual indicator $G_{real}$ for image noise in the MR images 82 (corresponding to the mean square g-factor) were determined for this sample. Since the SENSE reconstruction can be divided in the readout direction, only the middle slices were processed for simplicity. The results for two different data sets are presented in the table above. Corresponding results can also be reproduced for random undersampling schemes 50.

Although quantitatively different results were obtained—in particular for higher acceleration factors—for the indicator calculated according to Equation 7 or, respectively, for the actual value of the signal noise in the MR images, the arrangement of the results remains consistent between the samples with the same total acceleration. In this sense, the indicator according to Equation 7 can be used for a qualitative comparison of different undersampling schemes 50 with a different number of sample points 51.

Naturally, the features of the embodiments that are described in the preceding and aspects of the invention can be combined with one another. The features can be used not only in the described combinations but also in other combinations or independently without departing from the scope of the invention.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method of operating a magnetic resonance (MR) apparatus comprising an MR data acquisition unit with a plurality of radio-frequency (RF) reception coils, said method comprising:

before acquiring MR data with said MR data acquisition unit, wherein respective MR data will be acquired individually by the respective plurality of RF reception coils and the acquired MR data will be entered into data points in a memory organized as k-space according to a random sampling scheme by which fewer than all available data points in k-space will be sampled, determining, in a processor, a set of sample points comprising all data points in k-space that will be sampled in order to acquire MR data when said random sampling scheme is utilized;

in said processor, using said determined set of sample points in order to calculate a noise indicator value that mathematically represents a correlation of noise produced by respective contributions to said determined set of sample points by respective signals individually acquired by the respective reception coils;

in said processor, determining an additional data point from among said data points in said memory that are potentially available for having an MR data entry entered therein, with said additional data point not being in said determined set of sample points;

in said processor, calculating an amount of change of said noise indicator value that results by an addition of said additional data point into said determined set of sample points;

in said processor, selectively adding or not adding said additional data point into said determined set of sample points dependent on the amount of change of said noise indicator value, in order to obtain an operational set of sample points;

after obtaining said operational set of sample points, operating said MR data acquisition unit in order to acquire said MR data with said reception coils and in order to enter the acquired MR data into said memory at said operational set of sample points in k-space according to said random sampling scheme; and in said processor, reconstructing a set of reconstructed MR data from the MR data entered into k-space at said operational set of sample points, and providing the reconstructed MR data as an available data file at an output of said processor.

2. A method as claimed in claim 1, comprising:

in said processor, adding said calculated amount of change of the noise indicator value to the previously calculated noise indicator value, in order to produce an updated noise indicator value, when said additional data point is added to said determined set of sample points; and with said processor, determining said additional data point, calculating said amount of change of said noise indicator value, selectively adding or not adding said additional data point to said determined set of sample points, and producing said updated indicator noise value, for respectively different additional data points in k-space that are not in said determined set of sample points, until said updated noise indicator value is less than a signal noise threshold, and thereafter acquiring said reduced MR data, or determining a further set of sample points.

3. A method as claimed in claim 1, comprising:

in said processor, adding said calculated amount of change of the noise indicator value to the previously calculated noise indicator value, in order to produce an updated noise indicator value, when said additional data point is added to said determined set of sample points; and with said processor, determining said additional data point, calculating said amount of change of said noise indicator value, selectively adding or not adding said additional data point to said determined set of sample points, and producing said updated noise indicator value, for respectively different additional data points in k-space that are not in said determined set of sample points, until a number of sample points in said determined set of sample points becomes equal to a predetermined number, and thereafter acquiring said reduced MR data or determining a further set of sample points.

4. A method as claimed in claim 1, comprising:

in said processor, determining respective reception sensitivities of the respective reception coils in said plurality of reception coils; and in said processor, determining a noise covariance matrix by measurement of at least one of correlations and self-correlations of signal noise in respective signals received by said respective reception coils, and calculating said noise indicator value from said reception sensitivities and said noise covariance matrix.

5. A method as claimed in claim 4 comprising in and with said processor calculating said noise indicator value by:

calculating an inverse partial noise image in k-space separately for said determined set of sample points and for said additional data point from the respective reception sensitivities and said noise covariance matrix;

discarding elements of the inverse partial image noise matrices in k-space for the determined set of sample points, and for the additional data point, that correspond to locations in k-space that have a distance from a center of k-space that is larger than a threshold; and calculating said amount of change of said noise value indicator by adding the inverse partial noise matrices in k-space for said determined set of sample points and for said additional data point, in order to obtain a summed matrix, and inverting said summed matrix.

6. A method as claimed in claim 4 comprising in and with said processor implementing said discarding by:

calculating an inverse partial image noise matrix in k-space for each sample point from said determined set of sample points;

calculating an inverse diagonal partial image noise matrix in k-space for each sample point from said determined set of sample points by discarding non-diagonal elements of the inverse partial image noise matrix in k-space for that respective sample point; and adding the inverse diagonal partial image noise matrix in k-space for all sample points of said determined set of sample points in order to obtain a diagonal inverse partial image noise matrix in k-space for said determined set of sample points.

7. A method as claimed in claim 6 further comprising in and with said processor:

inverting said inverse diagonal partial image noise matrix in k-space for the determined set of sample points in order to obtain a diagonal partial image noise matrix in k-space; and calculating a spur of said diagonal partial image noise matrix for said determined set of sample points in k-space as said noise indicator value.

8. A method as claimed in claim 7 further comprising in and with said processor, calculating the inverse diagonal partial image noise matrix $\Xi(k)$ in k-space for the set of sample points according to:

$$\Xi(k) = \sum_{p_n} \Delta(p_n - k)$$
$$= \sum_{p_n} \sum_{i,j} c_i^H(p_n - k)\Psi_{ij}^{-1}c_j(p_n - k)$$

wherein k designates a location in k-space, i,j indicate the reception coils, $\Psi_{ij}^{-1}$ designates noise covariance matrix, $c_i^H(k)$ designates the sensitivity of the i-th coil at the location k in k-space, $p_n$ designates the set of sample points, and wherein $\Delta(p_n-k)$ designates the diagonal inverse partial image noise matrix in k-space for one of the sample points from the determined set of sample points.

9. A method as claimed in claim 8 comprising in and with said processor calculating the spur $\sigma^2$ of the diagonal partial image noise matrix in k-space for the determined set of sample points as said noise indicator value according to:

$$\sigma^2 = \sum_k \left[\sum_{p_n} \Delta(p_n - k)\right]^{-1}.$$

10. A method as claimed in claim 5 comprising calculating in and with said processor, the amount of change of the noise indicator value based on the reception sensitivities and the determined noise covariance matrix, by:

calculating an inverse partial image noise matrix in k-space for the additional data point from the determined sensitivities of the reception coils and from the determined noise covariance matrix;

calculating a diagonal inverse partial image noise matrix in k-space for the additional data point by discarding non-diagonal elements of the inverse partial image noise matrix in k-space; and adding the diagonal inverse partial image noise matrix in k-space for the additional sample point to the inverse diagonal partial image noise matrix in k-space for all sample points of the determined set of sample points in order to obtain a modified diagonal inverse partial image noise matrix in k-space for the determined set of sample points with the additional data point added.

11. A method as claimed in claim 10 comprising with and in said processor, calculating the inverse diagonal partial image noise matrix $\Xi(k)$ in k-space of the set of sample points according to:

$$\Xi(k) = \sum_{p_n} \Delta(p_n - k) = \sum_{p_n} \sum_{i,j} c_i^H(p_n - k)\Psi_{ij}^{-1} c_j(p_n - k)$$

wherein k designates a location in k-space, i,j indicate the reception coils, $\Psi_{ij}^{-1}$ designates noise covariance matrix, $c_i^H(k)$ designates the sensitivity of the i-th coil at the location k in k-space, $p_n$ designates the set of sample points, and wherein $\Delta(p_n-k)$ designates the diagonal inverse partial image noise matrix in k-space for one of the sample points from the determined set of sample points.

12. A method as claimed in claim 1, comprising, in said processor, normalizing the calculated noise indicator value with respect to a predetermined number of sample points in said set of sample points.

13. A method as claimed in claim 1, wherein each coil of said plurality of reception coils has a sensitivity, and comprising, in said processor, automatically adjusting a spatial dependency of each of the plurality of reception coils respectively in order to cause the respective reception sensitivity, of a respective reception coil in a center of k-space, to have a defined ratio relative to a respective sensitivity of said respective reception coils at non-central k-space locations.

14. A magnetic resonance (MR) apparatus comprising:
an MR data acquisition unit with a plurality of radio-frequency (RF) reception coils;
a processor configured to determine, before acquiring MR data with said MR data acquisition unit wherein MR data will be acquired individually by the plurality of respective RF reception coils and the acquired MR data will be entered into data points in a memory organized as k-space according to a random sampling scheme by which fewer than all available data points in k-space will be sampled, a set of sample points comprising all data points in k-space that will be sampled in order to acquire MR data when said random sampling scheme is utilized;
said processor being configured to use said determined set of sample points in order to calculate a noise indicator value that mathematically represents a correlation of noise produced by respective contributions to said determined set of sample points by respective signals individually acquired by the respective reception coils;
said processor being configured to determine an additional data point from among said data points in said memory that are potentially available for having an MR data entry entered therein, with said additional data point not being in said determined set of sample points;
said processor being configured to calculate an amount of change of said noise indicator value that results by an addition of said additional data point into said determined set of sample points;
said processor being configured to add or not add said additional data point into said determined set of sample points dependent on the amount of change of said noise indicator value, in order to obtain an operational set of sample points;
after obtaining said operational set of sample points, said processor being configured to operate said MR data acquisition unit in order to acquire said MR data with said reception coils in order to enter the acquired MR data into said memory at said operational set of sample points in k-space according to said random sampling scheme; and
said processor being configured to reconstruct a set of reconstructed MR data from the MR data entered into k-space at said operational set of sample points, and to provide the reconstructed MR data as an available data file at an output of said processor.

15. An MR apparatus as claimed in claim 14, wherein said processor is further configured to:
calculate an inverse partial image noise matrix in k-space for each sample point from the determined set of sample points;
calculate a diagonal inverse partial image noise matrix in k-space for each sample point from the determined set of sample points by discarding non-diagonal elements of the inverse partial image noise matrix in k-space for the respective sample point; and
add the diagonal inverse partial image noise matrix in k-space for all sample points of the determined set of sample points in order to obtain the diagonal inverse partial image noise matrix in k-space for the determined set of sample points.

* * * * *